United States Patent
Hsu et al.

(10) Patent No.: US 6,368,964 B1
(45) Date of Patent: Apr. 9, 2002

(54) METHOD FOR REDUCING RESISTANCE IN A CONDUCTOR

(75) Inventors: Hsin-Hui Hsu; De-Yuan Wu, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/731,839

(22) Filed: Dec. 8, 2000

(51) Int. Cl.[7] ................... H01L 21/302; H01L 21/461
(52) U.S. Cl. ........................... 438/672; 438/283
(58) Field of Search ................. 438/455, 629, 438/635, 639, 654, 669, 672, 685, 693, 283, 284, 286, 305, 306, 618, 623

(56) References Cited

U.S. PATENT DOCUMENTS

| | | | | |
|---|---|---|---|---|
| 5,168,078 A | * | 12/1992 | Reisman et al. | 438/455 |
| 5,200,359 A | * | 4/1993 | Pearey et al. | 438/629 |
| 5,209,816 A | * | 5/1993 | Yu et al. | 438/693 |
| 5,667,630 A | * | 9/1997 | Lo | 438/653 |
| 6,169,306 B1 | * | 1/2001 | Gardner et al. | 257/310 |
| 6,291,333 B1 | * | 9/2001 | Lou | 438/618 |

* cited by examiner

Primary Examiner—David Nelms
Assistant Examiner—Phuc T. Dang
(74) Attorney, Agent, or Firm—Winston Hsu

(57) ABSTRACT

The present invention provides a method of reducing resistance in an Al-containing conductor. An Al oxide layer is first formed on the surface of an Al-containing conductor followed by the formation of a Ti layer and a barrier layer above the Al oxide layer, respectively. Finally, a W contact plug is formed within the barrier layer. The Al oxide layer functions in preventing a reaction between the Ti layer and the conductor during high temperature formation of the W contact plugs to avoid the influence of resistance in the Al-containing conductor.

12 Claims, 1 Drawing Sheet

METHOD FOR REDUCING RESISTANCE IN A CONDUCTOR

BACKGROUND OF THE INVENTION

1. Field of the Invention

The present invention relates to a semiconductor process, and more particularly, to a method of reducing resistance in a conductor.

2. Description of the Prior Art

In a multilevel metallization process, metallic conductive layers connect each of the metal oxide semiconductor (MOS) transistors on the semiconductor wafer to form a stacked circuit structure. The multilevel metallization process improves the integration of the semiconductor wafer and is therefore commonly applied to very large scale integration (VLSI) processes.

FIG. 1 is a schematic diagram of a prior art conductor and plurality of contact plugs. In the prior art method, a sputtering method is used to deposit an Aluminum (Al) layer on the surface of a semiconductor wafer as the first step in the formation of an Aluminum-Copper/ Titanium/ Titanium nitride (Al/Ti/TiN) conductive layer. However, the result may cause the opening of the Al wire due to electron migration of the Al atoms. To prevent such a problem from occurring, the prior art method adds approximately 0.5%–4% Copper (Cu) to the Al to form an Al—Cu layer 10.

Secondly, a Ti metal layer 12 is deposited on the surface of the Al—Cu layer 10 with a thickness of deposition of approximately 200–500 angstroms. Then, a TiN layer is formed on the surface of the Ti layer 12 as a barrier layer 14 with a thickness of approximately 500–1500 angstroms. In general, there are two different methods for the formation of the barrier layer 14. One method is a proceeding nitridation of Ti layer 12 and the other method is the use of areactive sputtering method to directly deposit a TiN layer on the surface of Ti layer 12.

After formation of the conductive layer, its pattern is defined by both lithography and etching processes. Then, a dielectric layer is formed between the MOS transistor and each conductive layer to separate and protect the devices on the semiconductor wafer. In a multilevel metallization process, a contact plug is formed within the dielectric layer to act as a conductive wire between each MOS transistor and conductive layer to form a complete electrical device.

In the prior art method of fabricating a contact hole on the surface of a semiconductor transistor, a plurality of plug holes are formed within a dielectric layer 16. The plug holes lead to the surface of an outside-connecting conductive field, such as a source/drain of a MOS transistor or the surface of other lower conductors. Then, a glue layer and a Tungsten (W) layer are deposited on both the dielectric layer 16 and on the conductive field on the bottom of each plug hole. Next, an etch back process is performed to align the surface of the W layer with the surface of the dielectric layer 16 to form contact plugs 18.

In the prior art method, a sputtering temperature greater than 400° C. is required to deposit the W layer. However, the increase in heat affects the structure of the conductive layer. Under the temperature of W formation, Ti is very easily reactive with Al. It leads to the formation of a high resistance Al—Ti complex which increases the resistance of the conductor to affect the electrical performance of the conductor.

SUMMARY OF THE INVENTION

It is therefore a primary objective of the present invention to provide a method of reducing resistance in an Al-containing conductor to solve the mentioned above problem.

In the present invention an Al oxide layer is first formed on the surface of the Al-containing conductor followed by the formation of a Ti layer and a barrier layer above the Al oxide layer, respectively. Finally, a W contact plug is formed above the barrier layer. The Al oxide layer functions in preventing a high temperature reaction between the Ti layer and the conductor during formation of the W contact plug, to avoid the influence of resistance in the Al-containing conductor.

In the present invention, a thin Al oxide layer is formed on the surface of the conductor to effectively prevent a high temperature reaction between the Ti layer and the Al layer during formation of the W plug and prevent an increase of resistance in the conductor.

| SYMBOL DESCRIPTION OF THE DRAWINGS | |
|---|---|
| 10 Aluminum-Copper layer | 12 Titanium layer |
| 14 Barrier layer (Titanium oxide layer) | |
| 16 Dielectric layer | |
| 18 Contact plug | 20 Conductor |
| 22 Aluminum oxide layer | 24 Titanium layer |
| 26 Barrier layer (Titanium oxide layer) | |
| 28 Dielectric layer | |
| 30 Contact plug | |

DETAILED DESCRIPTION OF THE PREFERRED EMBODIMENT

Figure 1:
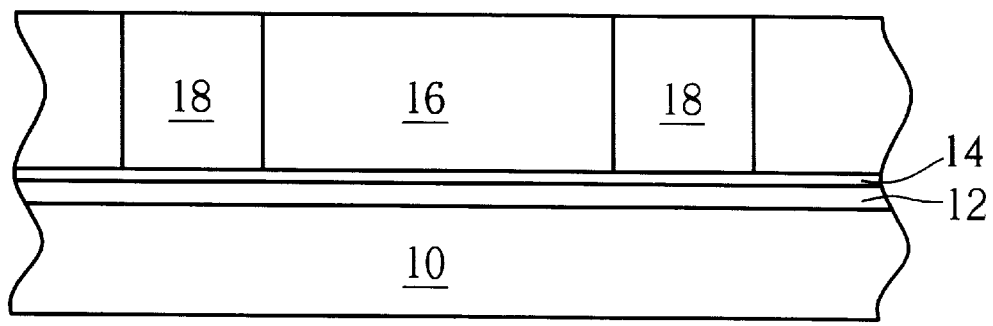
FIG. 1 is the schematic diagram of the formation of a conductor layer and plurality of contact plugs of the prior art.
Figure 2:
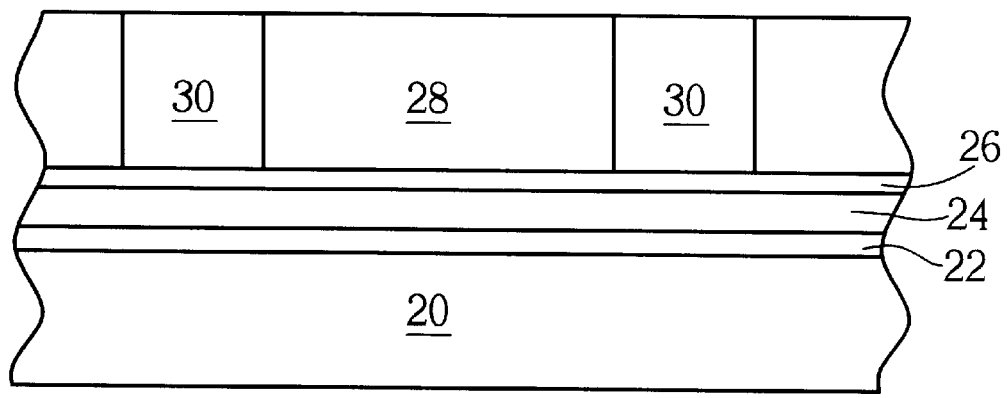
FIG. 2 is the schematic diagram of the formation of a low resistance conductive layer and plurality of contact plugs of the present invention.

Please refer to FIG. 2. FIG. 2 is the schematic diagram of a low resistance conductor according to the present invention. The conductor can be located above or between each MOS device, or within the connecting layer of each metal. As shown in FIG. 2, a low pressure sputtering process is used to deposit an Al or AlCu alloy conductor 20 on the surface of a substrate (not shown). Then, the surface of the Al-containing conductor 20 is exposed to an oxygen-containing environment or an oxygen-containing plasma to react to form an Al oxide layer 22, w with the thickness of the Al oxide layer 22 being less than 50 angstroms. Next, a more reductive Ti layer 24 is formed a above the Al oxide layer 22 followed by a TiN constituted barrier layer 26 formed above the Ti layer 24 to complete the formation of the conductive layer.

After the fabrication of the conductive layer, a dielectric layer 28 is formed to surround each conductive layer to separate and protect the device on the semiconductor wafer. In order to form a complete electrical device, it is necessary to form a contact plug to act as a conductive wire between each MOS transistor or other device and the conductive layer. As shown in FIG. 2, the dielectric layer 28 is formed above the TiN layer 26 of the conductive layer. Then, plug holes are formed within the dielectric layer 28 whereby each plug hole is filled in by W to form contacts plug 30; a temperature greater than 400° C. is needed during the filling process.

Because of the formation of the Al oxide layer between the Al—Cu alloy and the Ti layer, it prevents the contact between the two layers and therefore prevent the formation of an Al—Ti compound occurring during high temperature formation of the W plugs. The mere 50 angstrom thickness of the Al oxide layer leads to its disappearance from the semiconductor wafer after its reaction with the more reductive Ti layer 24.

In comparison to the prior art method of forming a conductor, the method of the present invention prevents the reaction between the Al—Cu alloy and Ti and therefore prevents the formation of a compound between the metals. The result avoids an increase of resistance in the conductor leading to an improved performance in the final wafer product.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of reducing resistance of an aluminum-containing conductor which is formed on the surface of a substrate, the method comprising:

forming an aluminum oxide layer on the surface of the aluminum-containing conductor; forming a metal layer on the aluminum oxide layer, wherein the metal layer is made up of a metal that is a reducing agent of aluminum oxide; and forming a barrier layer on the metal layer.

2. The method of claim 1 wherein the aluminum-containing conductor is made up of aluminum or an alloy of aluminum and copper.

3. The method of claim 1 wherein the surface of the aluminum-containing conductor is exposed to an oxygen-containing environment to form the aluminum oxide layer.

4. The method of claim 1 wherein an oxygen-containing plasma is used to react with the surface of the aluminum-containing conductor to form the aluminum oxide layer.

5. The method of claim 1 wherein the aluminum oxide layer has a thickness of less than 50 angstroms.

6. The method of claim 1 wherein the metal layer is made up of titanium.

7. The method of claim 1 wherein the barrier layer is made up of titanium nitride.

8. A method of reducing resistance of an aluminum-containing conductor which is formed on the surface of a substrate, the method comprising:

forming an aluminum oxide layer on the surface of the aluminum-containing conductor;

forming a titanium layer on the aluminum oxide layer;

forming a titanium nitride layer on the titanium layer;

forming a dielectric layer on the titanium nitride layer;

forming a plug hole in the dielectric layer; and filling tungsten into the plug hole to forming the tungsten plug;

wherein the aluminum oxide layer prevents a reaction between the titanium layer with the aluminum-containing conductor during a thermal process of forming the tungsten plug to reduce the resistance of the aluminum-containing conductor.

9. The method of claim 8 wherein the aluminum-containing conductor is made up of aluminum or an alloy of aluminum and copper.

10. The method of claim 8 wherein the surface of the aluminum-containing conductor is exposed to an oxygen-containing environment to form the aluminum oxide layer.

11. The method of claim 8 wherein an oxygen-containing plasma is used to react with the surface of the aluminum-containing conductor to form the aluminum oxide layer.

12. The method of claim 8 wherein the aluminum oxide layer has a thickness of less than 50 angstroms.

* * * * *